United States Patent
Kameoka

(10) Patent No.: US 10,418,966 B2
(45) Date of Patent: Sep. 17, 2019

(54) ELASTIC WAVE DEVICE HAVING A CUT IN A BUSBAR ELECTRODE LAYER

(71) Applicant: Murata Manufacturing Co., Ltd., Nagaokakyo-shi, Kyoto-fu (JP)

(72) Inventor: Yoshinori Kameoka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 137 days.

(21) Appl. No.: 15/375,221

(22) Filed: Dec. 12, 2016

(65) Prior Publication Data

US 2017/0187350 A1    Jun. 29, 2017

(30) Foreign Application Priority Data

Dec. 25, 2015    (JP) ................................ 2015-254157

(51) Int. Cl.
*H03H 9/64*      (2006.01)
*H03H 9/145*      (2006.01)
(Continued)

(52) U.S. Cl.
CPC .............. *H03H 9/205* (2013.01); *H03H 3/08* (2013.01); *H03H 9/02992* (2013.01);
(Continued)

(58) Field of Classification Search
CPC ........ H03H 3/02; H03H 3/08; H03H 9/02897; H03H 9/02992; H03H 9/14541;
(Continued)

(56) References Cited

U.S. PATENT DOCUMENTS 5,821,834 A * 10/1998 Xu ....................... H03H 9/0057
                                              333/193
5,955,933 A * 9/1999 Nishihara .......... H03H 9/02944
                                            310/313 B
(Continued)

FOREIGN PATENT DOCUMENTS

JP       11-220351      *    8/1999
JP       2002-100952 A      4/2002
(Continued)

OTHER PUBLICATIONS

English language machine translation of JP 2004-260691 A, published Sep. 16, 2004, 9 pages. (Year: 2004).*
Official Communication issued in Japanese Patent Application No. 2015-254157, dated May 22, 2018.

*Primary Examiner* — Barbara Summons
(74) *Attorney, Agent, or Firm* — Keating & Bennett, LLP

(57) ABSTRACT

An elastic wave device includes a piezoelectric substrate, and elastic wave elements on the piezoelectric substrate and including IDT electrodes, respectively. The IDT electrode of a first of the elastic wave elements includes first and second busbars, and the IDT electrode of a second of the elastic wave elements includes third and fourth busbars. The second busbar and the third busbar extend parallel or substantially parallel to each other, and are spaced by a gap in a direction perpendicular or substantially perpendicular to an elastic-wave propagating direction. Each of the second and third busbars includes first and second electrode layers at least a portion of which is laminated on the first electrode layer. The second electrode layer of the second busbar is cut in at least one location in a direction crossing the elastic-wave propagating direction.

16 Claims, 5 Drawing Sheets

(51) Int. Cl.
  *H03H 9/25*    (2006.01)
  *H03H 3/08*    (2006.01)
  *H03H 9/205*   (2006.01)
  *H03H 9/70*    (2006.01)
  *H03H 9/02*    (2006.01)
  *H03H 9/72*    (2006.01)
  *H03H 3/02*    (2006.01)
  *H03H 9/56*    (2006.01)

(52) U.S. Cl.
  CPC ...... *H03H 9/14541* (2013.01); *H03H 9/6433* (2013.01); *H03H 9/6483* (2013.01); *H03H 9/70* (2013.01); *H03H 9/725* (2013.01); *H03H 3/02* (2013.01); *H03H 9/562* (2013.01)

(58) Field of Classification Search
  CPC .......... H03H 9/205; H03H 9/25; H03H 9/562; H03H 9/6433; H03H 9/6483; H03H 9/70; H03H 9/725
  USPC .......... 333/133, 193–196; 310/313 B, 313 D
  See application file for complete search history.

(56) References Cited

U.S. PATENT DOCUMENTS

| | | | |
|---|---|---|---|
| 6,404,101 B1* | 6/2002 | Taniguchi | H03H 9/0222 310/313 A |
| 6,753,641 B2* | 6/2004 | Takamine | H03H 9/0042 310/313 B |
| 2002/0014934 A1* | 2/2002 | Nakamura | H03H 9/0028 333/195 |
| 2002/0057036 A1 | 5/2002 | Taniguchi et al. | |
| 2011/0193655 A1* | 8/2011 | Kamiguchi | H03H 3/08 333/186 |
| 2012/0274418 A1 | 11/2012 | Takata et al. | |
| 2013/0002372 A1 | 1/2013 | Uesaka | |
| 2013/0307639 A1* | 11/2013 | Mori | H03H 9/725 333/133 |

FOREIGN PATENT DOCUMENTS

| | | |
|---|---|---|
| JP | 2004-260691 A | 9/2004 |
| JP | 2010-28701 A | 2/2010 |
| JP | 2014-17537 A | 1/2014 |
| WO | 2011/092876 A1 | 8/2011 |
| WO | 2011/115014 A1 | 9/2011 |

* cited by examiner

ELASTIC WAVE DEVICE HAVING A CUT IN A BUSBAR ELECTRODE LAYER

CROSS REFERENCE TO RELATED APPLICATIONS

This application claims the benefit of priority to Japanese Patent Application No. 2015-254157 filed on Dec. 25, 2015. The entire contents of this application are hereby incorporated herein by reference.

BACKGROUND OF THE INVENTION

1. Field of the Invention

The present invention relates to an elastic wave device.

2. Description of the Related Art

Elastic wave devices have been widely used in, for example, filters of cellular phones. Japanese Unexamined Patent Application Publication No. 2002-100952 discloses one example of an elastic wave device including IDT (interdigital transducer) electrodes. Each of busbars of the IDT electrodes includes a lower layer wiring and an upper layer wiring laminated on the lower layer wiring.

Recently, in order to satisfy a demand for further size reduction of the elastic wave device, the distance between adjacent busbars of the IDT electrodes has gradually decreased due to design of arranging elastic wave resonators closer to each other in a direction perpendicular to an elastic-wave propagating direction. On the other hand, in a ladder filter, for example, a size of the IDT electrode of the elastic wave resonator taken along the elastic-wave propagating direction has increased to improve filter characteristics, and hence a length of the busbar has also increased. Accordingly, when the elastic wave resonators including the IDT electrodes, which have the busbars of two-layer structure and which are horizontally elongated as in Japanese Unexamined Patent Application Publication No. 2002-100952, are arranged close to each other, a formation failure or defect in the busbars is likely to occur, thus resulting in a possibility that short-circuiting may occur between the adjacent busbars. For that reason, it has been difficult to arrange the IDT electrodes in a sufficiently close relation, and to provide satisfactory size reduction of the elastic wave device.

SUMMARY OF THE INVENTION

Preferred embodiments of the present invention provide a reduced size elastic wave device in which a formation failure or defect in busbars is less likely to occur in a region where IDT electrodes are adjacent to or in a vicinity of each other.

According to a preferred embodiment of the present invention, an elastic wave device includes a piezoelectric substrate, and a plurality of elastic wave elements provided on the piezoelectric substrate and including IDT electrodes, respectively. The plurality of elastic wave elements includes a first elastic wave element and a second elastic wave element. The IDT electrode of the first elastic wave element includes first and second busbars that oppose each other, and the IDT electrode of the second elastic wave element includes third and fourth busbars that oppose each other. The second busbar and the third busbar extend parallel or substantially parallel to each other and a gap is included between the second busbar and the third busbar in a direction perpendicular or substantially perpendicular to an elastic-wave propagating direction. Each of the second and third busbars includes a first electrode layer and a second electrode layer, and at least a portion of the second electrode layer is laminated on the first electrode layer. The second electrode layer of the second busbar is cut in at least one location in a direction crossing the elastic-wave propagating direction.

In a preferred embodiment of the present invention, the second electrode layer of the second busbar is cut in a direction perpendicular or substantially perpendicular to the elastic-wave propagating direction.

In another preferred embodiment of the present invention, the second electrode layer of the third busbar is cut in at least one location in a direction crossing the elastic-wave propagating direction. Accordingly, a failure or defect in the second and third busbars is less likely to occur.

In another preferred embodiment of the present invention, the second electrode layer of the third busbar is cut in a direction perpendicular or substantially perpendicular to the elastic-wave propagating direction.

In another preferred embodiment of the present invention, the second electrode layer of the third busbar is cut in a portion corresponding to an extension from a cut portion of the second electrode layer of the second busbar, the extension extending in a direction in which the second electrode layer of the second busbar is cut.

In another preferred embodiment of the present invention, the plurality of elastic wave elements includes one or more serial arm resonators and a plurality of parallel arm resonators, and the first and second elastic wave elements are included in the plurality of parallel arm resonators. Accordingly, a formation failure or defect in the busbars of the parallel arm resonators is less likely to occur even when lengths of the parallel arm resonators in the elastic-wave propagating direction are increased. As a result, filter characteristics of the elastic wave device are able to be improved, and the size of the elastic wave device is able to be further reduced.

In another preferred embodiment of the present invention, the elastic wave device further includes a first band pass filter and a second band pass filter. A pass band of the second band pass filter is different from a pass band of the first band pass filter, and the first band pass filter includes at least one of the first and second elastic wave elements.

In another preferred embodiment of the present invention, the first band pass filter includes one of the first and second elastic wave elements, and the second band pass filter includes the other of the first and second elastic wave elements. Accordingly, a distance between the first band pass filter and the second band pass filter is able to be further reduced. As a result, the size of the elastic wave device is able to be further reduced.

With the elastic wave device according to the preferred embodiments of the present invention, a formation failure or defect in the busbars is less likely to occur in a region where the IDT electrodes are adjacent to or in a vicinity of each other, and a reduction in size is able to be provided.

The above and other elements, features, steps, characteristics and advantages of the present invention will become more apparent from the following detailed description of the preferred embodiments of the present invention with reference to the attached drawings.

DETAILED DESCRIPTION OF THE PREFERRED EMBODIMENTS

The features of the present invention will be clarified through the following description of specific preferred embodiments of the present invention with reference to the drawings.

It is to be noted that the preferred embodiments disclosed in this specification are merely illustrative, and that components or configurations in the different preferred embodiments may be partly exchanged or combined with each other.

First Preferred Embodiment

Figure 1:
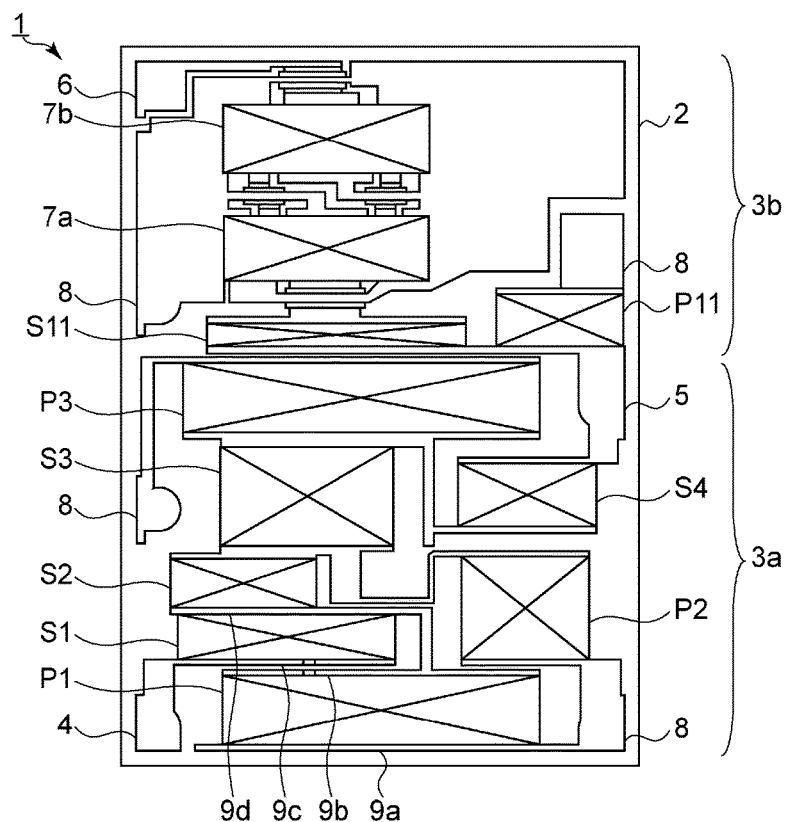
FIG. 1 is a schematic plan view of an elastic wave device according to a first preferred embodiment of the present invention.
Figure 2:
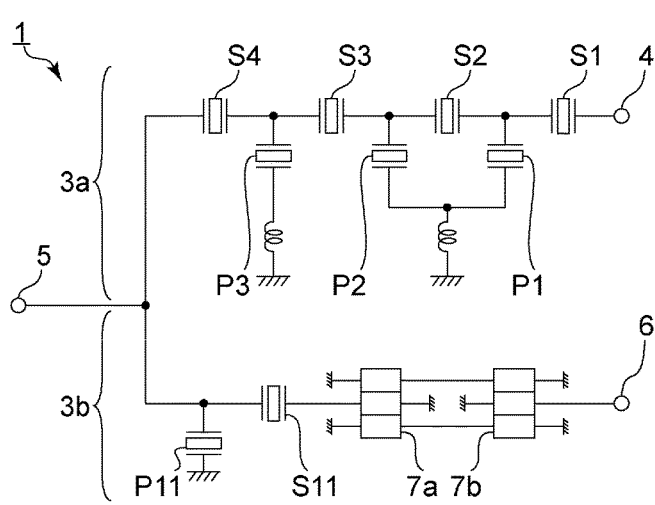
FIG. 2 is a circuit diagram of the elastic wave device according to the first preferred embodiment of the present invention.

FIG. 1 is a schematic plan view of an elastic wave device according to a first preferred embodiment of the present invention. FIG. 2 is a circuit diagram of the elastic wave device according to the first preferred embodiment. In FIG. 1, elastic wave resonators and longitudinally-coupled resonator-type elastic wave filters are represented by two diagonal lines in a polygon. The features and elements shown in FIG. 1 are similarly applied to FIGS. 5, 6, 8 and 10, which are described below.

The elastic wave device according to the first preferred embodiment is a duplexer 1 shown in FIG. 1. The duplexer 1 includes a piezoelectric substrate 2. The piezoelectric substrate 2 includes, for example, a piezoelectric single crystal such as LiNbO$_3$ or LiTaO$_3$, or an appropriate piezoelectric ceramic.

The duplexer 1 includes a first band pass filter 3a and a second band pass filter 3b with a pass band different from a pass band of the first band pass filter 3a. Both of the band pass filters 3a and 3b are provided on the piezoelectric substrate 2. The first band pass filter 3a is a transmission filter, and the second band pass filter 3b is a reception filter.

The duplexer 1 is provided on the piezoelectric substrate 2 and includes an antenna terminal 5 that is connected to an antenna. The first and second band pass filters 3a and 3b are connected in common to the antenna terminal 5.

The first band pass filter 3a corresponds to, for example, an elastic wave device according to a preferred embodiment of the present invention.

Each of the first and second band pass filters 3a and 3b includes a plurality of elastic wave elements. Each of the plurality of elastic wave elements includes an IDT electrode. In more detail, as shown in FIG. 2, the first band pass filter 3a includes, as the plurality of elastic wave elements, serial arm resonators S1 to S4 and parallel arm resonators P1 to P3. The first band pass filter 3a is a ladder filter.

Figure 3:
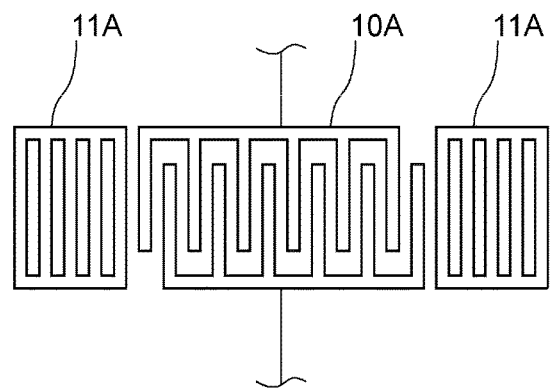
FIG. 3 is a plan view showing an electrode arrangement of a serial arm resonator in the first preferred embodiment of the present invention.

FIG. 3 is a plan view showing an electrode arrangement of the serial arm resonator S1 in the first preferred embodiment.

The serial arm resonator S1 includes an IDT electrode 10A provided on the piezoelectric substrate 2. Reflectors 11A and 11A are located on both sides of the IDT electrode 10A in an elastic-wave propagating direction. Similarly, each of the other serial arm resonators S2 to S4, the parallel arm resonators P1 to P3, and later-described elastic wave resonators S11 and P11, shown in FIG. 2, includes an IDT electrode and a pair of reflectors.

The second band pass filter 3b includes, as the plurality of elastic wave elements, first and second longitudinally-coupled resonator-type elastic wave filters 7a and 7b, and the elastic wave resonators S11 and P11.

Figure 4:
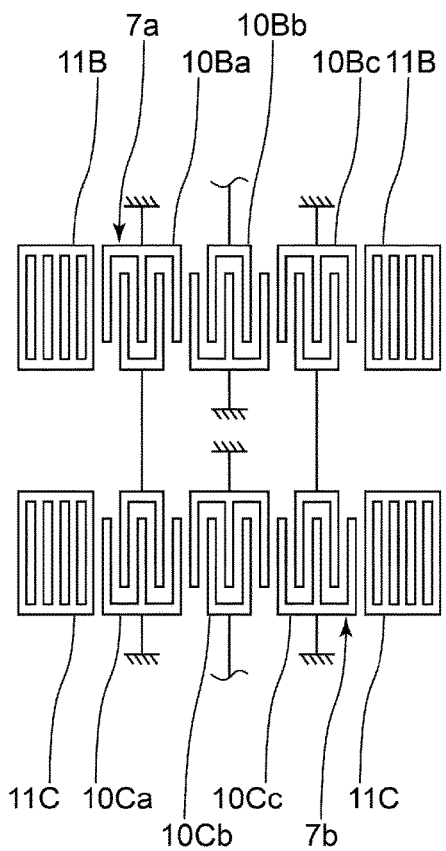
FIG. 4 is a plan view showing electrode arrangements of first and second longitudinally-coupled resonator-type elastic wave filters in the first preferred embodiment of the present invention.

FIG. 4 is a plan view showing electrode arrangements of the first and second longitudinally-coupled resonator-type elastic wave filters in the first preferred embodiment.

The first longitudinally-coupled resonator-type elastic wave filter 7a includes IDT electrodes 10Ba to 10Bc. Reflectors 11B and 11B are located on both sides of the IDT electrodes 10Ba to 10Bc in the elastic-wave propagating direction. The second longitudinally-coupled resonator-type elastic wave filter 7b includes IDT electrodes 10Ca to 10Cc. Reflectors 11C and 11C are located on both sides of the IDT electrodes 10Ca to 10Cc in the elastic-wave propagating direction.

Figure 5:
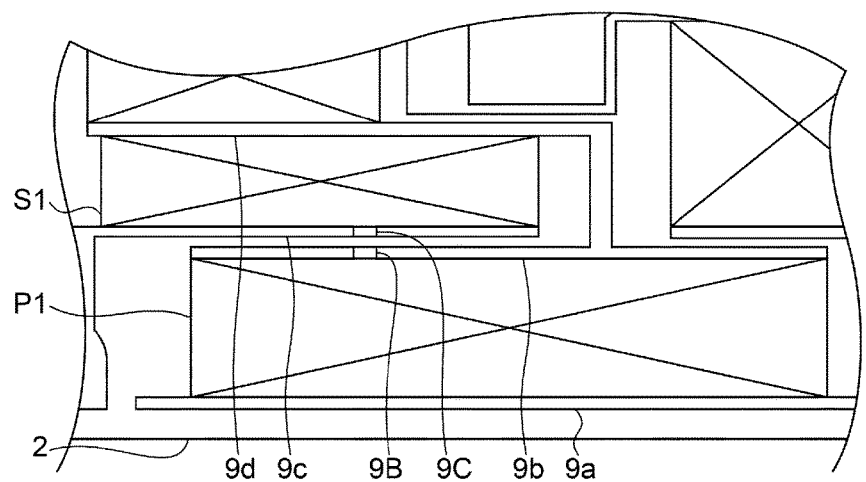
FIG. 5 is an enlarged schematic plan view of the elastic wave device according to the first preferred embodiment of the present invention.

FIG. 5 is an enlarged schematic plan view of the elastic wave device according to the first preferred embodiment.

As shown in FIG. 5, the parallel arm resonator P1 in the first band pass filter 3a corresponds to a first elastic wave element. The IDT electrode of the parallel arm resonator P1 includes first and second busbars 9a and 9b that are opposed to each other. On the other hand, the serial arm resonator S1 corresponds to a second elastic wave element. The IDT electrode of the serial arm resonator S1 includes third and fourth busbars 9c and 9d that are opposed to each other.

The first to fourth busbars 9a to 9d each extend in a lengthwise direction. The second busbar 9b and the third busbar 9c extend parallel or substantially parallel to each other. In the first preferred embodiment, the lengthwise direction is a direction parallel or substantially parallel to the elastic-wave propagating direction in each of the parallel arm resonator P1 and the serial arm resonator S1. A gap is included between the second busbar 9b and the third busbar 9c in a direction perpendicular or substantially perpendicular to the lengthwise direction.

Each of the second and third busbars 9b and 9c includes a first electrode layer and a second electrode layer laminated on the first electrode layer. In the first preferred embodiment, each of the first and fourth busbars 9a and 9d also includes a first electrode layer and a second electrode layer laminated on the first electrode layer. An electrical resistance is able to be reduced with the two-layer structure of the first electrode layer and the second electrode layer. According to a modification of the first preferred embodiment, each of at least the second and third busbars 9b and 9c includes the first and second electrode layers. Furthermore, according to a modification of the first preferred embodiment, the second electrode layer is partially laminated on the first electrode layer.

In the first and second band pass filters, for example, each of the busbars of the IDT electrodes in all the elastic wave elements preferably includes electrode layers corresponding to the above-described first and second electrode layers. Accordingly, the electrical resistance is able to be further reduced.

The second busbar 9b includes a cut portion 9B where the second electrode layer is cut in a direction perpendicular or substantially perpendicular to the lengthwise direction of the second busbar 9b to be partially separated. The first electrode layer of the second busbar 9b is exposed in the cut portion 9B.

Similarly, the third busbar 9c includes a cut portion 9C where the second electrode layer is cut in a direction perpendicular or substantially perpendicular to the lengthwise direction of the third busbar 9c to be partially separated. In more detail, the second electrode layer of the third busbar 9c is cut in a portion corresponding to an extension from the cut portion 9B of the second busbar 9b, the extension extending in the direction in which the second electrode layer of the second busbar 9b is cut. The first electrode layer of the third busbar 9c is exposed in the cut portion 9C.

The first preferred embodiment includes the feature of the second electrode layer of the second busbar 9b and the second electrode layer of the third busbar 9c each being cut to be partially separated, as described above. Accordingly, a formation failure or defect in the busbars is less likely to occur in a region where the IDT electrodes are adjacent to or in a vicinity of each other. In addition, a reduction in size of the duplexer 1 is able to be provided. The above features are described below with a detailed description of the duplexer 1 and a non-limiting example of a method of manufacturing the duplexer 1.

As shown in FIG. 2, the first band pass filter 3a includes an input terminal 4. The serial arm resonators S1 to S4 are connected in series between the input terminal 4 and the antenna terminal 5.

The parallel arm resonator P1 is connected between a ground potential and a junction of the serial arm resonator S1 closest to the input terminal 4 and the serial arm resonator S2. The parallel arm resonator P2 is connected between the ground potential and a junction of the serial arm resonator S2 and the serial arm resonator S3. The parallel arm resonator P3 is connected between the ground potential and a junction of the serial arm resonator S3 and the serial arm resonator S4. However, the circuit configuration of the first band pass filter 3a is not limited to the particular configuration described above.

The second band pass filter 3b includes an output terminal 6. The first and second longitudinally-coupled resonator-type elastic wave filters 7a and 7b are connected in series between the antenna terminal 5 and the output terminal 6. The elastic wave resonator S11 for characteristic adjustment is connected between the antenna terminal 5 and the first longitudinally-coupled resonator-type elastic wave filter 7a. The elastic wave resonator P11 for characteristic adjustment is connected between a junction of the antenna terminal 5 and the elastic wave resonator S11 for characteristic adjustment and the ground potential. However, the circuit configuration of the second band pass filter 3b is not limited to the particular configuration described above.

As shown in FIG. 1, a plurality of ground terminals 8 is located on the piezoelectric substrate 2. The plurality of ground terminals 8 is connected to a ground potential.

One non-limiting example of a manufacturing process of the duplexer 1, that is, the elastic wave device according to the first preferred embodiment, is described below.

Figure 6:
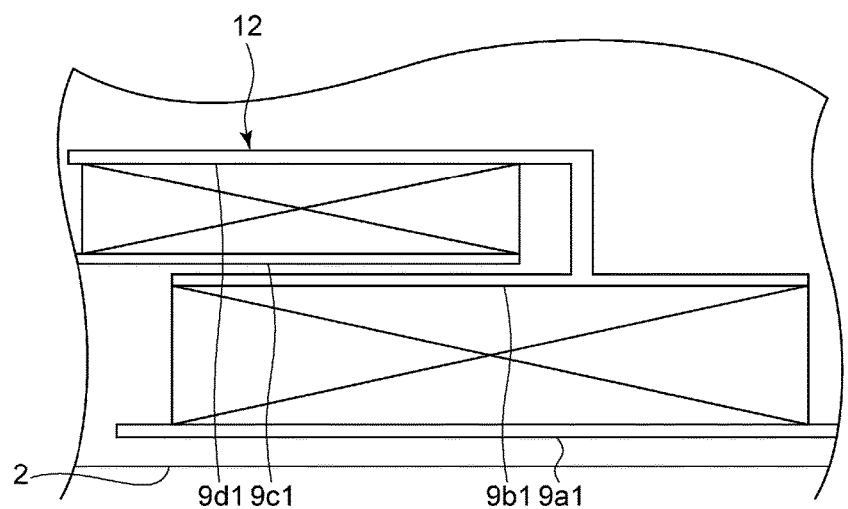
FIG. 6 is a schematic plan view of a portion corresponding to first and second elastic wave elements, the view being referenced to explain a manufacturing process of the elastic wave device according to the first preferred embodiment of the present invention.
Figure 7:
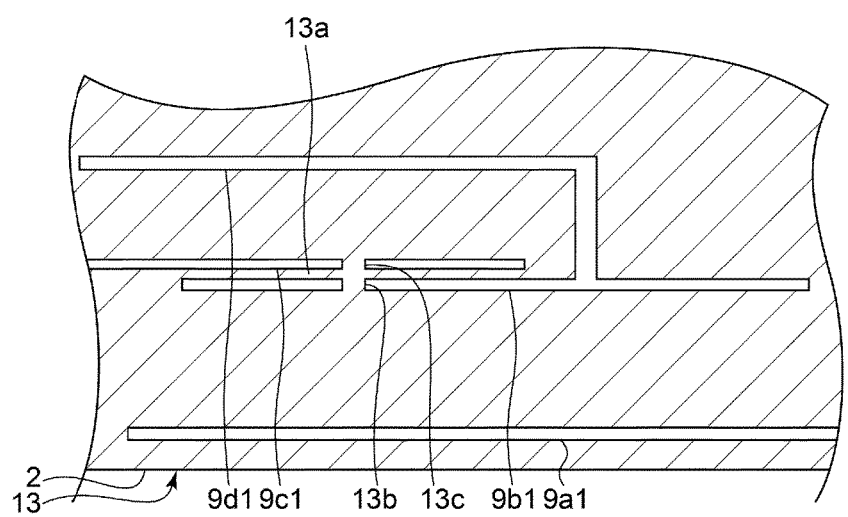
FIG. 7 is a schematic plan view of the portion corresponding to the first and second elastic wave elements, the view being referenced to explain the manufacturing process of the elastic wave device according to the first preferred embodiment of the present invention.
Figure 8:
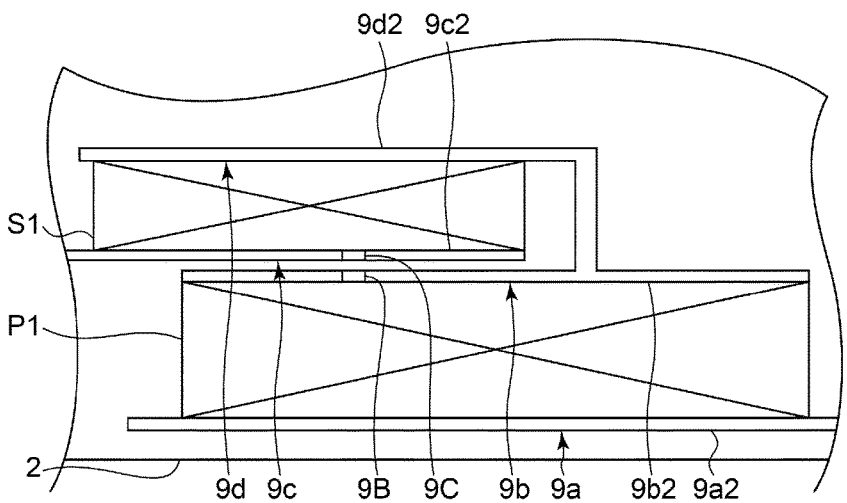
FIG. 8 is a schematic plan view of the portion corresponding to the first and second elastic wave elements, the view being referenced to explain the manufacturing process of the elastic wave device according to the first preferred embodiment of the present invention.

FIG. 6 is a schematic plan view of a portion corresponding to the first and second elastic wave elements, the view being referenced to explain the manufacturing process of the elastic wave device according to the first preferred embodiment. FIG. 7 is a schematic plan view of the portion corresponding to the first and second elastic wave elements, the view being referenced to explain the manufacturing process of the elastic wave device according to the first preferred embodiment. FIG. 8 is a schematic plan view of the portion corresponding to the first and second elastic wave elements, the view being referenced to explain the manufacturing process of the elastic wave device according to the first preferred embodiment. In FIGS. 6 to 8, electrode arrangements for the other elastic wave elements on the piezoelectric substrate than the first and second elastic wave elements are omitted. Moreover, as described above, the first and second elastic wave elements are the parallel arm resonator P1 and the serial arm resonator S1, respectively, shown in FIG. 5. In FIG. 7, a region where a later-described resist pattern is provided is indicated by hatching.

As shown in FIG. 6, the piezoelectric substrate 2 is prepared. Then, a metal film is provided on the piezoelectric substrate 2. The metal film is able to be provided by, for example, sputtering or chemical vapor deposition (CVD). Then, a first wiring layer 12 is provided by patterning the metal film with photolithography. The first wiring layer 12 includes electrodes in respective first layers of the IDT electrodes and the reflectors. Respective first electrode layers 9a1 to 9d1 of the above-described first to fourth busbars are provided through the steps described above.

Next, as shown in FIG. 7, a resist pattern 13 is provided on the piezoelectric substrate 2 to cover a portion of the first wiring layer 12. The resist pattern 13 covers individual electrode fingers of the IDT electrodes. The resist pattern 13 includes portions opened at positions above the first electrode layers 9a1 to 9d1 of the first to fourth busbars. In a later-described step, respective second electrode layers of the first to fourth busbars are provided in the opened regions.

A thickness of the resist pattern 13 is preferably larger than a thickness of the first wiring layer 12 shown in FIG. 6. Accordingly, thicknesses of respective second electrode layers of the first to fourth busbars are able to be increased, and electrical resistances are able to be further reduced.

The resist pattern 13 includes a narrow width portion 13a that is positioned between the first electrode layer 9b1 of the second busbar and the first electrode layer 9c1 of the third busbar, and that extends along the first electrode layers 9b1 and 9c1. The narrow width portion 13a extends over an entire length of a region where the first electrode layers 9b1 and 9c1 of the second and third busbars are positioned in an opposing relation. A width of the narrow width portion 13a is equal or substantially equal to a size of the narrow width portion 13a in a direction crossing the direction in which the narrow width portion 13a extends. As the distance between the second busbar and the third busbar shortens, the width of the narrow width portion 13a is reduced.

In a step shown in FIG. 7, the resist pattern 13 includes reinforcement portions 13b and 13c that reinforce the narrow width portion 13a. In more detail, the reinforcement portion 13b is provided on the first electrode layer 9b1 of the second busbar. The reinforcement portion 13b connects the narrow width portion 13a and the other portion of the resist pattern 13. Similarly, the reinforcement portion 13c is provided on the first electrode layer 9c1 of the third busbar. The reinforcement portion 13c also connects the narrow width portion 13a and the other portion of the resist pattern 13. As described below, the second electrode layer of the second busbar and the second electrode layer of the third busbar are cut in regions corresponding to the reinforcement portions 13b and 13c, respectively.

A failure or defect, such as a positional deviation, in the narrow width portion 13a is more likely to occur as the width of the narrow width portion 13a reduces and the thickness thereof increases. Furthermore, the failure or defect in the narrow width portion 13a is more likely to occur as the length of the narrow width portion 13a increases. In view of the above-described unique structure, the narrow width portion 13a is reinforced by the reinforcement portions 13b and 13c. With the presence of the reinforcement portions 13b and 13c, the failure or defect in the narrow width portion 13a is significantly reduced or prevented even when the distance between the second busbar 9b and the third busbar 9c is shortened. In addition, the failure or defect in the narrow width portion 13a is significantly reduced or prevented even when the lengths of the second and third busbars are increased. As a result, a failure or defect in the second and third busbars, which are provided by patterning the resist pattern 13, is significantly reduced or prevented.

Thus, the failure or defect in the second and third busbars is significantly reduced or prevented by providing the reinforcement portions 13b and 13c and cutting each of the second electrode layers of the second and third busbars to be partially separated as described above.

According to a modification of the first preferred embodiment, at least one of the reinforcement portions 13b and 13c is provided at one location. Accordingly, the positional deviation of the narrow width portion 13a is less likely to occur. As an alternative, the reinforcement portion 13b or 13c may be provided in plural.

Next, a metal film is provided on the piezoelectric substrate 2 in both a portion covered with the resist pattern 13 and a portion not covered with the resist pattern 13. The resist pattern 13 is then peeled off. As a result, the second electrode layers 9a2 to 9d2 of the first to fourth busbars 9a to 9d are provided as shown in FIG. 8.

In the step of peeling off the resist pattern 13 as described above, the metal films on the reinforcement portions 13b and 13c of the resist pattern 13, shown in FIG. 7, are removed together. Thus, the cut portions 9B and 9C of the second and third busbars 9b and 9c are formed. As a result, the parallel arm resonator P1 and the serial arm resonator S1 are formed. Through the steps described above, the other elastic wave elements, including the elastic wave resonators and the longitudinally-coupled resonator-type elastic wave filters, are also formed at the same or substantially the same time.

As described above, the positional deviation of the narrow width portion 13a is less likely to occur even when the width of the narrow width portion 13a of the resist pattern 13 is reduced. Accordingly, a failure or defect in the second electrode layers 9b2 and 9c2 is less likely to occur even when the distance between the second and third busbars 9b and 9c in the direction perpendicular or substantially perpendicular to the lengthwise direction of the second and third busbars 9b and 9c is shortened. In addition, the failure or defect in the second electrode layers 9b2 and 9c2 is less likely to occur even when the lengths of the second and third busbars 9b and 9c are increased. Accordingly, short-circuiting between the second busbar 9b and the third busbar 9c is also less likely to occur. Moreover, a further reduction in size of the duplexer 1 is able to be provided.

Referring to FIG. 1, in the duplexer 1, the lengths of the parallel arm resonator P1 and the serial arm resonator S1 along the elastic-wave propagating direction are larger than those of the serial arm resonators S2 to S4 along the elastic-wave propagating direction. Accordingly, the number of pairs of electrode fingers of the IDT electrode in each of the parallel arm resonator P1 and the serial arm resonator S1 is able to be increased. As a result, filter characteristics, such as a Q value, are able to be improved. In this connection, a reduction in size of the duplexer 1 is able to be provided by arranging the parallel arm resonator P1 and the serial arm resonator S1 adjacent to or in a vicinity of each other in the direction perpendicular or substantially perpendicular to the elastic-wave propagating direction, as shown in FIG. 1. Furthermore, the distance between the parallel arm resonator P1 and the serial arm resonator S1 in the direction perpendicular or substantially perpendicular to the elastic-wave propagating direction is able to be shortened even more. It is hence possible to improve the filter characteristics, and to provide a further reduction in size of the duplexer 1.

The position at and the direction in which the second electrode layers of the second and third busbars 9b and 9c in the parallel arm resonator P1 and the serial arm resonator S1 are each cut to be partially separated are not particularly limited to the above description. According to a modification of the first preferred embodiment, preferably only the second electrode layers of the second and third busbars 9b and 9c are cut at positions opposing to each other. The second and third busbars 9b and 9c may be cut in a direction other than the direction perpendicular or substantially perpendicular to the lengthwise direction, that is, a direction crossing the lengthwise direction. Moreover, according to a modification of the first preferred embodiment, preferably only one of the second electrode layers of the second and third busbars 9b and 9c is cut in at least one location. Accordingly, the failure or defect in the second and third busbars 9b and 9c is less likely to occur.

A duplexer including the same arrangement as the duplexer of the first preferred embodiment and a duplexer of a comparative example were fabricated, and insertion losses of first band pass filters in both of the duplexers were compared. The duplexer of the comparative example includes a similar configuration as the duplexer of the first preferred embodiment except for that the former duplexer is not cut in portions corresponding to the second electrode layers of the second and third busbars.

Table 1, provided below, lists specifications of the IDT electrodes of the serial arm resonators S1 to S4, the parallel arm resonators P1 to P3, and the elastic wave resonators S11 and P11 in each of the duplexers according to the first preferred embodiment and the comparative example. Table 2, provided below, lists specifications of the IDT electrodes of the first and second longitudinally-coupled resonator-type elastic wave filters 7a and 7b. Specifications of the reflectors are also listed in Tables 1 and 2.

TABLE 1

| | IDT Electrode | | | Reflector | |
|---|---|---|---|---|---|
| | Number of Pairs of Electrode Fingers (pairs) | Inter-secting Width (μm) | Pitch of Electrode Fingers (μm) | Number of Electrode Fingers | Pitch of Electrode Fingers (μm) |
| Serial Arm Resonator S1 | 82 | 78.35 | 5.5475 | 9 | 5.5687 |
| Serial Arm Resonator S2 | 55 | 85.21 | 5.4568 | 3 | 5.5050 |
| Serial Arm Resonator S3 | 64 | 186.25 | 5.5687 | 9 | 5.6189 |
| Serial Arm Resonator S4 | 51 | 114.22 | 5.5214 | 7 | 5.5390 |
| Parallel Arm Resonator P1 | 113 | 125.20 | 5.7303 | 9 | 5.7303 |
| Parallel Arm Resonator P2 | 45 | 194.90 | 5.8004 | 9 | 5.8004 |
| Parallel Arm Resonator P3 | 126 | 129.26 | 5.7568 | 9 | 5.7568 |
| Elastic Wave Resonator S11 | 108 | 60.08 | 5.1695 | 5 | 5.1695 |
| Elastic Wave Resonator P11 | 27 | 94.86 | 5.7316 | 5 | 5.7316 |

TABLE 2

| | | Number of Pairs of Electrode Fingers in IDT Electrode (pairs) | Number of Electrode Fingers in Reflector | Inter-secting Width (μm) | Pitch of Electrode Fingers (μm) |
|---|---|---|---|---|---|
| First Longitu-dinally-Coupled Resonator-Type Elastic Wave Filter 7a | IDT ELECTRODE 10Ba | 8 | — | 116.32 | 5.3011 |
| | IDT ELECTRODE 10Bb | 23 | — | 116.32 | 5.3276 |
| | IDT ELECTRODE 10Bc | 8 | — | 116.32 | 5.3011 |
| | Reflector 11B | — | 54 | — | 5.4151 |
| Second Longitu-dinally-Coupled Resonator-Type Elastic Wave Filter 7b | IDT ELECTRODE 10Ca | 8 | — | 121.70 | 5.3119 |
| | IDT ELECTRODE 10Cb | 28 | — | 121.70 | 5.3603 |
| | IDT ELECTRODE 10Cc | 8 | — | 121.70 | 5.3119 |
| | Reflector 11C | — | 40 | — | 5.4613 |

Figure 9:
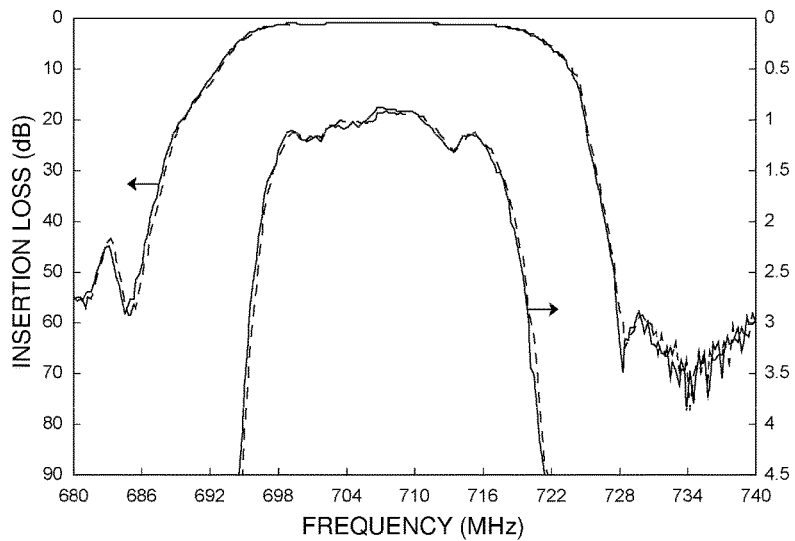
FIG. 9 is a graph plotting insertion losses of respective first band pass filters in the first preferred embodiment of the present invention and a comparative example.

FIG. 9 is a graph plotting insertion losses of the respective first band pass filters in the first preferred embodiment and the comparative example. A solid line represents the result of the first preferred embodiment, and a broken line represents the result of the comparative example.

As seen from FIG. 9, the insertion loss of the first band pass filter in the first preferred embodiment is equal or substantially equal to the insertion loss of the first band pass filter in the comparative example. Thus, the first preferred embodiment is able to provide the above-described advantageous effects without causing an insertion loss due to diffraction of the elastic wave and an increase of electrical resistance.

Second Preferred Embodiment

Figure 10:
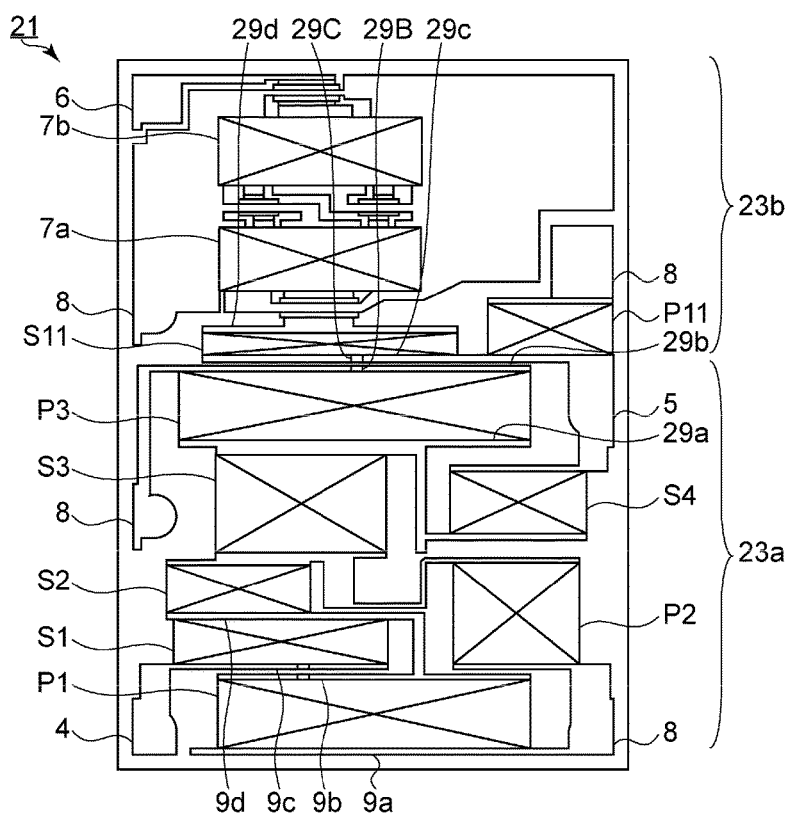
FIG. 10 is a schematic plan view of an elastic wave device according to a second preferred embodiment of the present invention.

FIG. 10 is a schematic plan view of an elastic wave device according to a second preferred embodiment of the present invention.

The elastic wave device according to the second preferred embodiment is a duplexer 21 shown in FIG. 10. The duplexer 21 is different from the duplexer 1 according to the first preferred embodiment in that each of first and second band pass filters 23a and 23b includes first and second elastic wave elements. The duplexer 21 includes the same or substantially the same elements and features as the duplexer 1 according to the first preferred embodiment in the elements and features other than those described above.

More specifically, the parallel arm resonator P3 in the first band pass filter 23a corresponds to the above-described first elastic wave element, and the elastic wave resonator S11 in the second band pass filter 23b corresponds to the above-described second elastic wave element. The parallel arm resonator P3 and the elastic wave resonator S11 are adjacent to or in a vicinity of each other in the direction perpendicular or substantially perpendicular to the elastic-wave propagating direction. The parallel arm resonator P3 includes first and second busbars 29a and 29b that are opposed to each other. The elastic wave resonator S11 includes third and fourth busbars 29c and 29d that are opposed to each other. The second busbar 29b and the third busbar 29c extend parallel or substantially parallel to each other. The second and third busbars 29b and 29c are arranged with a gap left therebetween in the direction perpendicular or substantially perpendicular to the lengthwise direction.

Each of the second and third busbars 29b and 29c includes a first electrode layer and a second electrode layer. At least a portion of the second electrode layer is laminated on the first electrode layer. The second electrode layers of the second busbar 29b and the third busbar 29c are cut, similar to the second and third busbars 9b and 9c in the first preferred embodiment. Thus, the second and third busbars 29b and 29c include cut portions 29B and 29C, respectively.

The duplexer 21 is able to be manufactured similar to the manufacturing process of the duplexer 1 according to the first preferred embodiment. More specifically, the second and third busbars 29b and 29c are able to be manufactured similar to the second and third busbars 9b and 9c in the parallel arm resonator P1 and the serial arm resonator S1. In the second preferred embodiment, therefore, a formation failure or defect in the second and third busbars 29b and 29c in the parallel arm resonator P3 and the elastic wave resonator S11 is less likely to occur in addition to the advantageous effects of the first preferred embodiment.

Furthermore, the distance between the first band pass filter 23a and the second band pass filter 23b is able to be shortened even more. Accordingly, the size of the duplexer 21 is able to be further reduced.

The preferred embodiments of present invention are able to be suitably applied to individual band pass filters as well without being limited to a duplexer. In addition, the preferred embodiments of present invention are able to be suitably applied to, for example, a multiplexer including three or more band pass filters.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric substrate; and
   a plurality of elastic wave elements provided on the piezoelectric substrate and including IDT electrodes, respectively; wherein the plurality of elastic wave elements includes a first elastic wave element and a second elastic wave element;

the IDT electrode of the first elastic wave element includes first and second busbars that oppose each other, and the IDT electrode of the second elastic wave element includes third and fourth busbars that oppose each other;

the second busbar and the third busbar extend parallel or substantially parallel to each other;

a gap is present between the second busbar and the third busbar in a direction perpendicular or substantially perpendicular to an elastic-wave propagating direction;

each of the second and third busbars includes a first electrode layer and a second electrode layer;

at least a portion of the first and second electrode layers is laminated on the first electrode layer;

the second electrode layer of the second busbar is cut in at least one location in a direction crossing the elastic-wave propagating direction;

each of the IDT electrodes of the first and second elastic wave elements includes a plurality of electrode fingers that are respectively connected to the second and third busbars; and a number of cuts in the second electrode layer of at least one of the second and third busbars is less than a number of the plurality of electrode fingers that are connected to the corresponding second or third busbar.

2. The elastic wave device according to claim 1, wherein the second electrode layer of the second busbar is cut in a direction perpendicular or substantially perpendicular to the elastic-wave propagating direction.

3. The elastic wave device according to claim 1, wherein the second electrode layer of the third busbar is cut in at least one location in a direction crossing the elastic-wave propagating direction.

4. The elastic wave device according to claim 3, wherein the second electrode layer of the third busbar is cut in a direction perpendicular or substantially perpendicular to the elastic-wave propagating direction.

5. The elastic wave device according to claim 3, wherein the second electrode layer of the third busbar is cut in a portion corresponding to an extension from a cut portion of the second electrode layer of the second busbar, the extension extending in a direction in which the second electrode layer of the second busbar is cut.

6. The elastic wave device according to of claim 1, wherein the plurality of elastic wave elements includes one or more serial arm resonators and a plurality of parallel arm resonators, and the first and second elastic wave elements are included in the plurality of parallel arm resonators.

7. The elastic wave device according to claim 1, further comprising:
a first band pass filter; and
a second band pass filter; wherein
a pass band of the second band pass filter is different from a pass band of the first band pass filter; and
the first band pass filter includes at least one of the first and second elastic wave elements.

8. The elastic wave device according to claim 7, wherein the first band pass filter includes one of the first and second elastic wave elements, and the second band pass filter includes the other of the first and second elastic wave elements.

9. The elastic wave device according to claim 7, wherein the plurality of elastic wave elements includes one or more serial arm resonators and a plurality of parallel arm resonators; and
the one or more serial arm resonators are connected in series between an input terminal of the first band pass filter and an antenna terminal.

10. The elastic wave device according to claim 9, wherein the second band pass filter includes an output terminal and a plurality of elastic wave filters connected in series between the output terminal and the antenna terminal.

11. The elastic wave device according to claim 1, wherein the plurality of elastic wave elements includes a plurality of serial arm resonators and a plurality of parallel arm resonators; and
at least one of the plurality of parallel arm resonators is connected between ground and a junction of two of the plurality of serial arm resonators.

12. The elastic wave device according to claim 1, wherein the second electrode layer of the second busbar is cut in a lengthwise direction of the second busbar to provide a cut portion of the second busbar.

13. The elastic wave device according to claim 12, wherein the first electrode layer of the second busbar is exposed in the cut portion of the second busbar.

14. The elastic wave device according to claim 1, wherein the second electrode layer of the third busbar is cut in a lengthwise direction of the third busbar to provide a cut portion of the third busbar.

15. The elastic wave device according to claim 14, wherein the first electrode layer of the third busbar is exposed in the cut portion of the third busbar.

16. A method of preparing the elastic wave device according to claim 1, comprising:
providing a first metal film on a piezoelectric substrate;
patterning the first metal film to provide a wiring layer;
covering at least a portion of the wiring layer with a resist pattern;
providing a second metal film on the piezoelectric substrate in at least a portion of the piezoelectric substrate covered by the resist pattern and a portion of the piezoelectric substrate not covered with the resist pattern; and
peeling off the resist pattern.

* * * * *